(12) United States Patent
Le Gallo-Bourdeau et al.

(10) Patent No.: US 10,971,226 B2
(45) Date of Patent: Apr. 6, 2021

(54) HYPER-DIMENSIONAL COMPUTING DEVICE

(71) Applicants: International Business Machines Corporation, Armonk, NY (US); ETH Zurich, Zurich (CH)

(72) Inventors: Manuel Le Gallo-Bourdeau, Zurich (CH); Kumudu Geethan Karunaratne, Gattikon (CH); Giovanni Cherubini, Rueschlikon (CH); Abu Sebastian, Adliswil (CH); Abbas Rahimi, Duebendorf (CH); Luca Benini, Zurich (CH)

(73) Assignees: International Business Machines Corporation, Armonk, NY (US); ETH ZURICH (EIDGENOESSISCHE TECHNISCHE HOCHSCHULE ZURICH), Zurich (CH)

( * ) Notice: Subject to any disclaimer, the term of this patent is extended or adjusted under 35 U.S.C. 154(b) by 0 days.

(21) Appl. No.: 16/426,536

(22) Filed: May 30, 2019

(65) Prior Publication Data
US 2020/0381048 A1  Dec. 3, 2020

(51) Int. Cl.
*G11C 11/00* (2006.01)
*G11C 13/00* (2006.01)

(52) U.S. Cl.
CPC ........ *G11C 13/0028* (2013.01); *G11C 13/004* (2013.01); *G11C 13/0026* (2013.01);
(Continued)

(58) Field of Classification Search
CPC .............. G11C 13/0028; G11C 13/004; G11C 13/0069; G11C 13/0026; G11C 2013/0042; G11C 2213/77
(Continued)

(56) References Cited

U.S. PATENT DOCUMENTS 7,489,583 B2 * 2/2009 Kuekes ................. B82Y 10/00
341/96
9,152,827 B2 10/2015 Linderman et al.
(Continued)

FOREIGN PATENT DOCUMENTS

EP  3261091 A1  12/2017

OTHER PUBLICATIONS

Li, et al., A Memristor Crossbar-Based Computation Scheme With High Precision, arXiv preprint arXiv:1611.03264, Nov. 19, 2016, 6 pages URL: https://arxiv.org/pdf/1611.03264.pdf.
(Continued)

*Primary Examiner* — Tha-O H Bui
(74) *Attorney, Agent, or Firm* — Daniel Morris; Otterstedt, Wallace & Kammer, LLP

(57) ABSTRACT

The device provides a resistive memory device for storing elements of hyper-dimensional vectors, in particular digital hyper-dimensional, as conductive statuses in components in particular in 2D-memristors, of the resistive memory device, wherein the resistive memory device provides a first crossbar array of the components, wherein the components are memristive 2D components addressable by word-lines and bit-lines, and a peripheral circuit connected to the word-lines and bit-lines and adapted for encoding operations by activating the word-lines and bit-lines sequentially in a predefined manner.

20 Claims, 10 Drawing Sheets

(52) U.S. Cl.
CPC .. *G11C 13/0069* (2013.01); *G11C 2013/0042* (2013.01); *G11C 2213/77* (2013.01)
(58) Field of Classification Search
USPC ........................................................ 365/148
See application file for complete search history.

(56) References Cited

U.S. PATENT DOCUMENTS

| | | | |
|---|---|---|---|
| 9,319,047 | B2 | 4/2016 | Jha et al. |
| 10,572,795 | B1* | 2/2020 | Dockendorf ............ G06N 3/08 |
| 2015/0170025 | A1 | 6/2015 | Wu et al. |
| 2018/0005110 | A1 | 1/2018 | Gokmen et al. |
| 2018/0075339 | A1 | 3/2018 | Ma et al. |

OTHER PUBLICATIONS

Hu, et al., Dot-Product Engine for Neuromorphic Computing: Programming 1T1M Crossbar to Accelerate Matrix-Vector Multiplication, Proceedings of the 53rd annual design automation conference. ACM, Mar. 3, 2016, 7 pages URL: https://www.labs.hpe.com/techreports/2016/HPE-2016-23.pdf.

Sharad, et al., Ultra Low Power Associative Computing With Spin Neurons and Resistive Crossbar Memory, Proceedings of the 50th Annual Design Automation Conference. ACM, 2013, 6 pages URL: https://arxiv.org/ftp/arxiv/papers/1304/1304.2281.pdf.

Li, et al., Hyperdimensional Computing With 3D VRRAM in-Memory Kernels: Device-Architecture Co-Design for Energy-Efficient, Error-Resilient Language Recognition, 2016 IEEE International Electron Devices Meeting (IEDM). IEEE, 2016, pp. 16.1.1-16.1.4.

Li, et al., Device-Architecture Co-Design for Huperdimensional Computing With 3D Vertical Resistive Switching Random Access Memory (3D VRRAM), 2017 International Symposium on VLSI Technology, Systems and Application (VLSI-TSA), IEEE, 2017, 2 pages.

Rahimi, et al High-Dimensional Computing as a Nanoscalable Paradigm, IEEE Transactions on Circuits and Systems-I: Regular Papers, vol. 64, No. 9, Sep. 2017, pp. 2508-2521.

Wu et al., Brain-Inspired Computing Exploiting Carbon Nanotube FETS and Resistive RAM: Hyperdimensional Computing Case Study, ISSCC 2018/Session 31/Computation in Memory for Machine Learning/31.3, pp. 491-493.

Montagna et al., "PULP-HD: Accelerating Brain-Inspired High-Dimensional Computing on a Parallel Ultra-Low Power Platform", Proceedings of the 55th Annual Design Automation Conference, DAC '18, 2018.

Manuel Le Gallo-Bourdeau et al., Unpublished U.S. Appl. No. 16/426,482, filed May 30, 2019, Device for High Dimensional Computing Comprising an Associative Memory Module, 25 Pages Plus 6 Sheets Drawings.

Kumudu Geethan Karunaratne et al., Unpublished U.S. Appl. No. 116/426,572, filed May 30, 2019, Device for Hyper-Dimensional Computing Tasks, 50 Pages Plus 7 Sheets Drawings.

Paul J. Otterstedt, Oct. 13, 2020, p. 1-2, List of IBM Patents or Patent Applications Treated as Related.

* cited by examiner 1000  method

| 1002 | storing elements of hyper-dimensional vectors in a resistive memory device |

| 1004 | connecting a peripheral circuit to the word-lines and bit-lines of the crossbar array |

| 1006 | activating selectively word-lines of hyper-dimensional vectors in the crossbar array |

| 1008 | determining, 1008, an Ngram HD vector by a binding operation |

| 1010 | combining output signals from memristive 2D components ... to perform an encoding |

FIG. 10

HYPER-DIMENSIONAL COMPUTING DEVICE

BACKGROUND

The invention relates generally to a device for hyper-dimensional computing and a related method for hyper-dimensional computing.

Currently, the industry as well as research institutions are experimenting with computing architectures that are different to traditional von-Neumann machines. A couple of reasons is driving this development: power consumption of traditional computing architectures, a limitation in computing speed increase due to physical limitations of the size of structures on semiconductor chips, a rapid increase in cognitive computing (which can be simulated with traditional technology but may better be addressed with new architectures), as well as an analysis requirements for unstructured or semi-structured data.

One approach for alternative computing architectures is based on hyper-dimensional (HD) computing which can be seen as a brain-inspired non-von-Neumann learning model based on representing information with high-dimensional vectors (thousands of dimensions). HD vectors are—in this computing architecture—holographic and (pseudo-) random with independent and identically distributed (i.i.d.) binary components. The HD vectors may be denoted as holographic because each bit position in the HD vector has an equal weight and something like an MSB (most significant bit) and an LSB (least significant bit) does not exist.

As a consequence, HD computing is extremely robust against failures, defects, variations and noise, all of which can be seen as very well suited for ultra-low energy computation on large-scale fabrics such as computational phase-change memory (PCM) devices.

At its very core, HD computing is about representing information as high-dimensional vectors and about manipulating them and comparing them (determining a distance) as large patterns within the memory. A processor based on HD computing can be realized as an extremely wide dataflow processor (not to be confused with classical von-Neumann machines) with a pretty small instruction set of bit-level operations on the HD vectors.

For learning and inference (query) tasks, the HD processor comprises at least three main modules: an item memory for random projection of information to the HD space (e.g., one character in the classical architecture being described by eight or 16 bits projected to a random vector with, e.g., 10,000 or so dimensions), an encoding unit (for combining a plurality of HD vectors), and an associative memory for storing HD vectors, which may also be used for distance computing between stored HD vectors and query vectors. Typically, a query vector having the shortest distance to one of the existing stored HD vectors (in a sparse associative memory) is seen as the answer to the query. The first two modules (item memory for random projection and encoding unit) utilize random indexing with Multiply-Add-Permute (MAP) operations allowing a high degree of parallelism, i.e., the stored vectors in the item memory are combined component-wise to produce another pattern for comparison in the associative memory.

In the associative memory module, the distance computing may be performed in a distributed fashion; however, this operation is the only one that requires a contribution from all the vector components in which the information is represented.

As an underlying example to the proposed concept, one may consider to have the task of classifying a given text (from which it is not automatically known in which language it is written) into one of the 21 European languages. Basically, each of the 27 letters of the Latin alphabet is encoded as a, e.g., 10k-dimensional random hyper-vector in an item memory. Based on the setup, the HD computing device shall be enabled to decide, in which language a presented text is written.

SUMMARY

According to one aspect of the present invention, a device for hyper-dimensional computing may be provided. The device may comprise a resistive memory device for storing elements of hyper-dimensional vectors as conductive statuses in components of the resistive memory device, wherein the resistive memory device comprises a first cross-bar array of the components. Thereby, the components may be memristive 2D components addressable by word-lines and bit-lines. The device may further comprise a peripheral circuit connected to the word-lines and bit-lines and adapted for encoding operations by activating the word-lines and bit-lines sequentially in a predefined manner.

According to another aspect of the present invention, a method for hyper-dimensional computing may be provided. The method may comprise storing elements of hyper-dimensional vectors in a resistive memory device as conductive statuses in components of the resistive memory device, wherein the resistive memory device comprises a first cross-bar array of the components, wherein the components are memristive 2D components addressable by word-lines and bit-lines, and connecting a peripheral circuit to the word-lines and bit-lines which is adapted for encoding operations by activating the word-lines and bit-lines sequentially in a predefined manner.

Additionally, the method may comprise activating selectively word-lines of hyper-dimensional vectors in the cross-bar array, wherein the selected hyper-dimensional vectors are to be bound together, and determining an Ngram hyper-dimensional vector by a binding operation using an output portion of the peripheral circuit.

It may be noted that the device is a component of computing device with a non-von-Neumann architecture.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
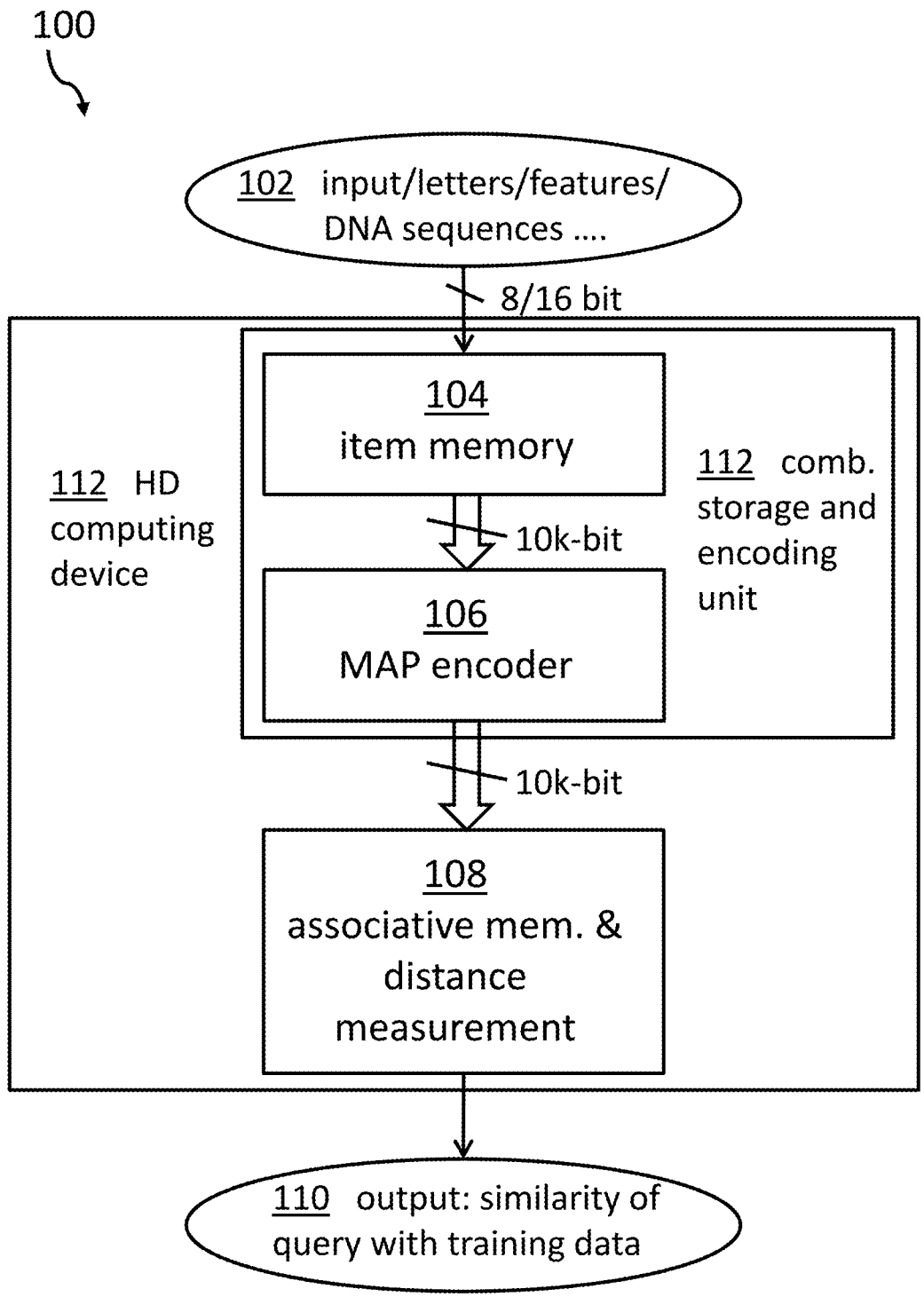

Preferred embodiments of the invention will be described, by way of example only, and with reference to the following drawings:

FIG. 1 shows a diagram of an embodiment of an architecture for which the here proposed high-dimensional computing device is suitable.

Figure 2:
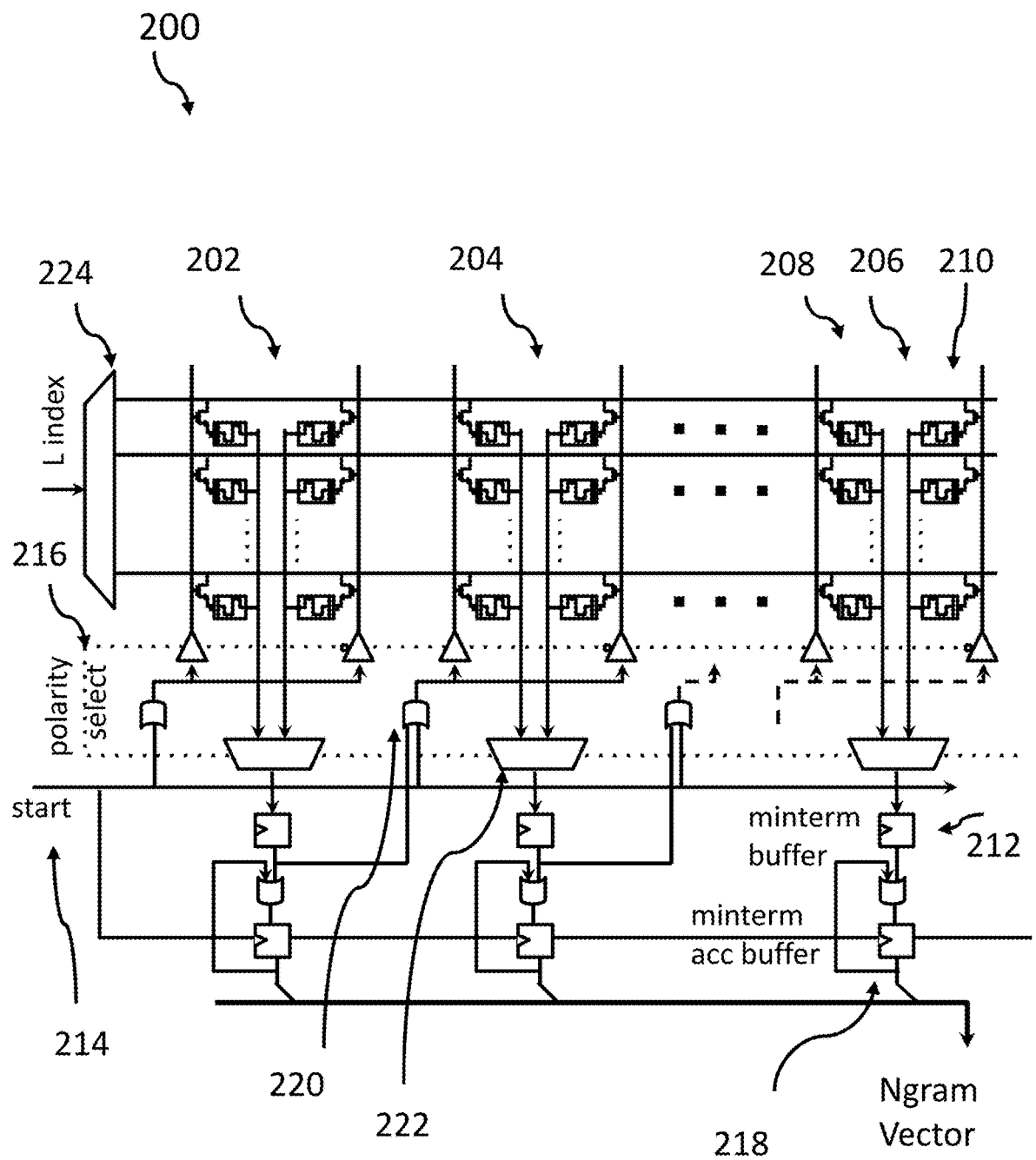

FIG. 2 shows a diagram of a first embodiment of a device for high-dimensional computing in which the encoding is performed in the memory domain.

Figure 3:
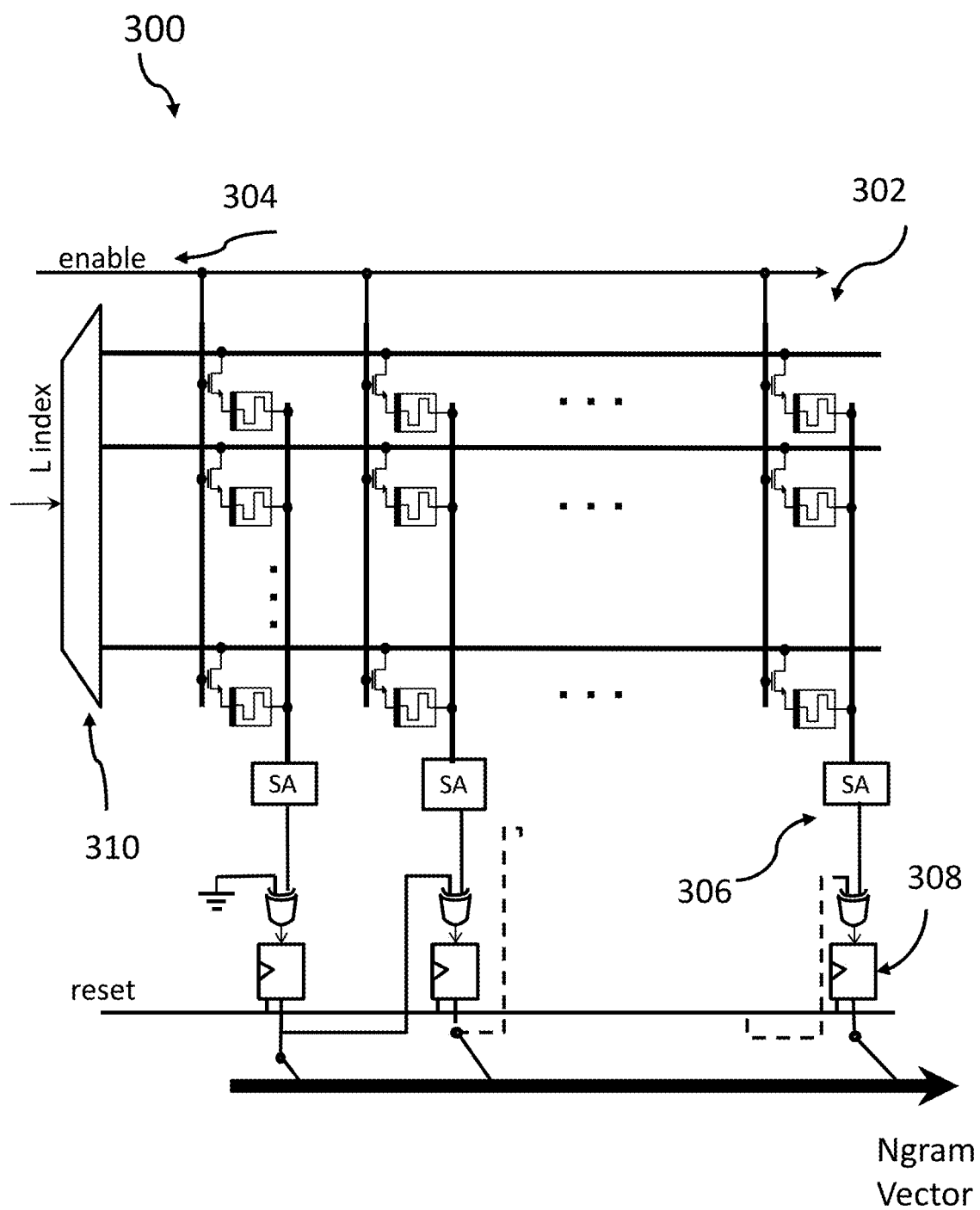

FIG. 3 shows a diagram of a second embodiment of a device for high-dimensional computing in which the encoding is performed in the digital domain.

Figure 4:
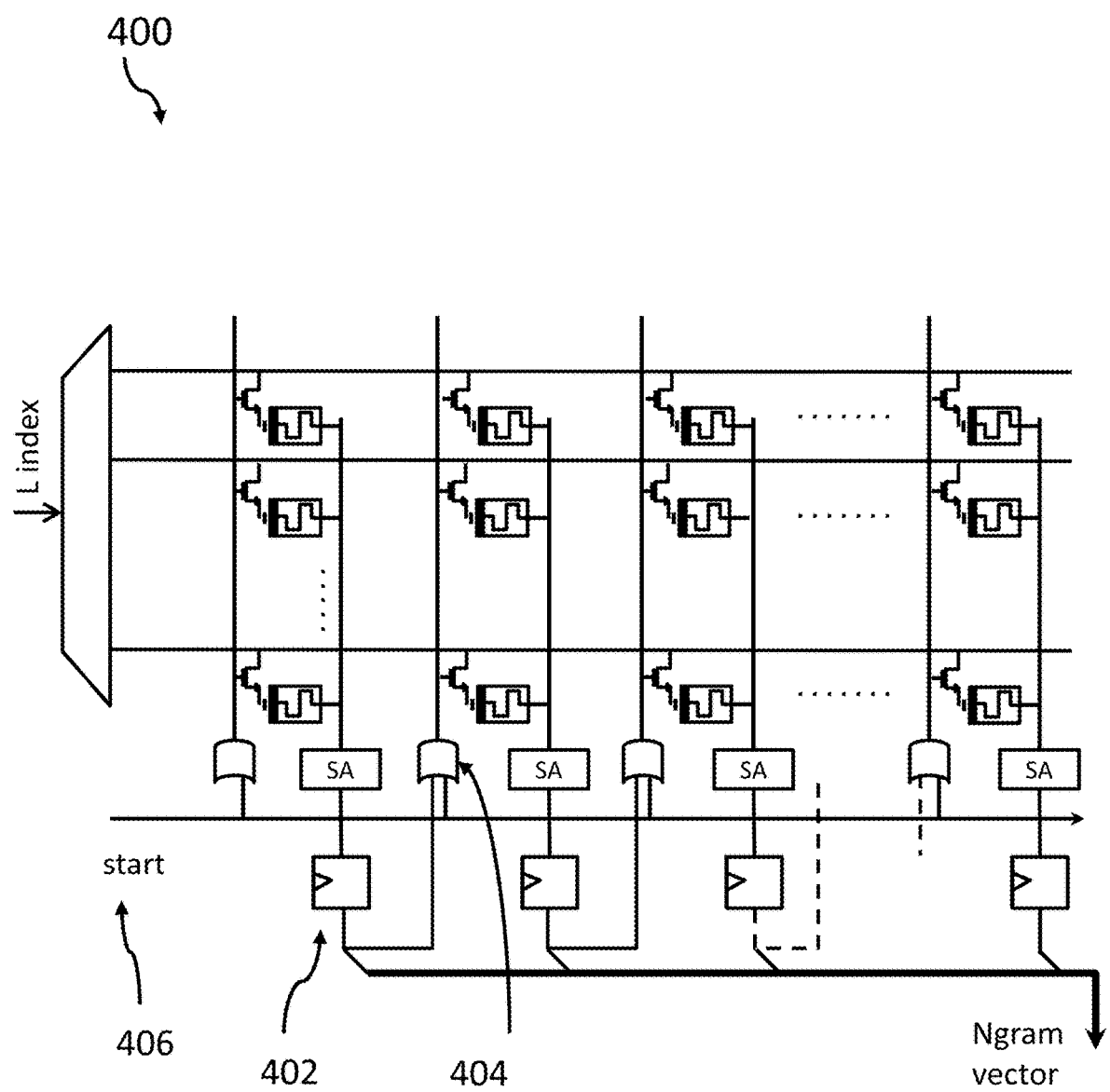

FIG. 4 shows a diagram of a third embodiment of a device for high-dimensional computing in which the encoding is performed in the memory domain.

Figure 5:
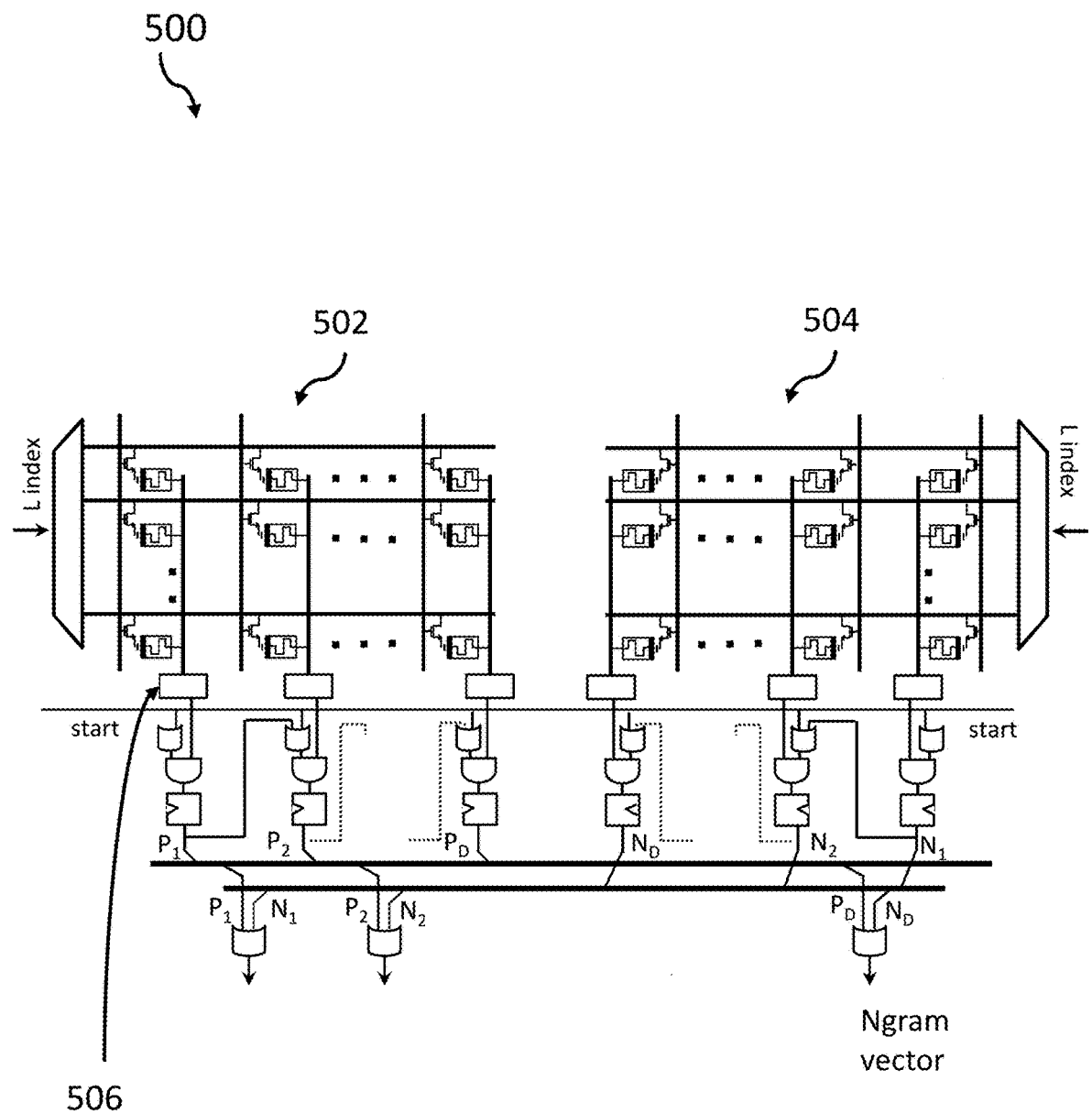

FIG. 5 shows a diagram of a fourth embodiment of a device for high-dimensional computing with two crossbars and an encoding in the digital domain.

Figure 6:
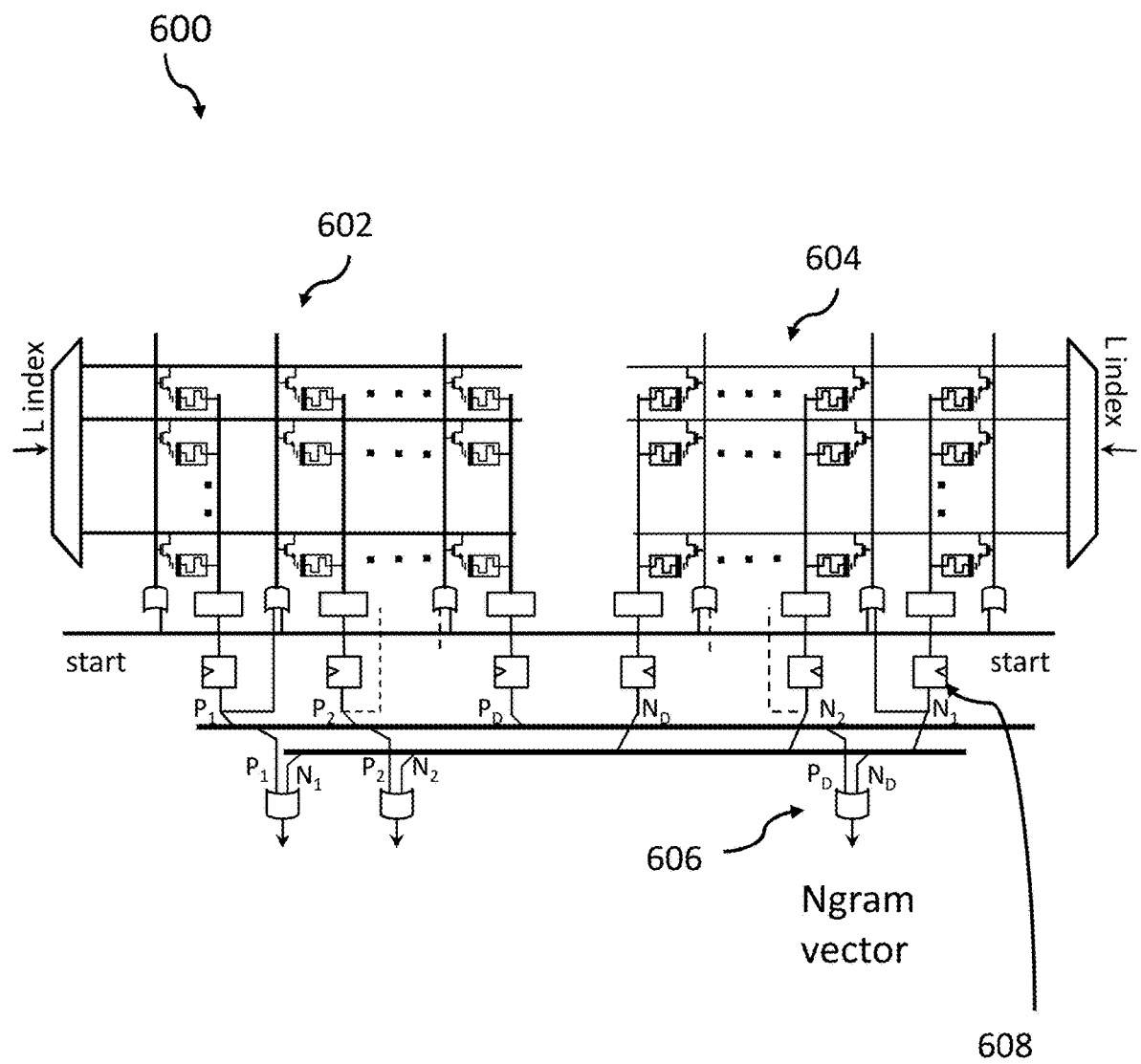

FIG. 6 shows a diagram of a fifth embodiment of a device for high-dimensional computing with two crossbars and an encoding in the memory domain.

Figure 7:
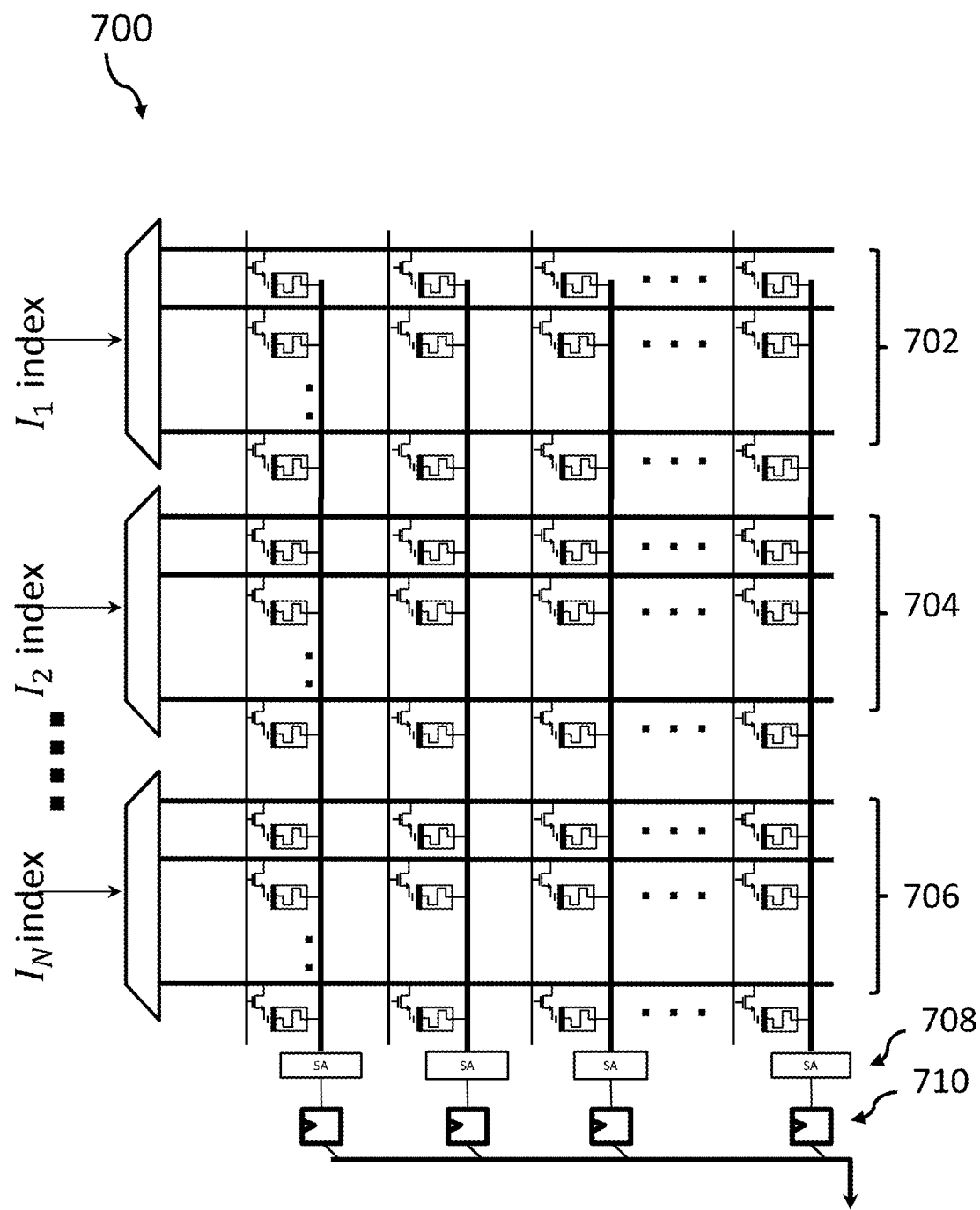

FIG. 7 shows a diagram of a sixth embodiment of a device for high-dimensional computing with a plurality of crossbars and an encoding with single maxterm in-memory binding.

Figure 8:
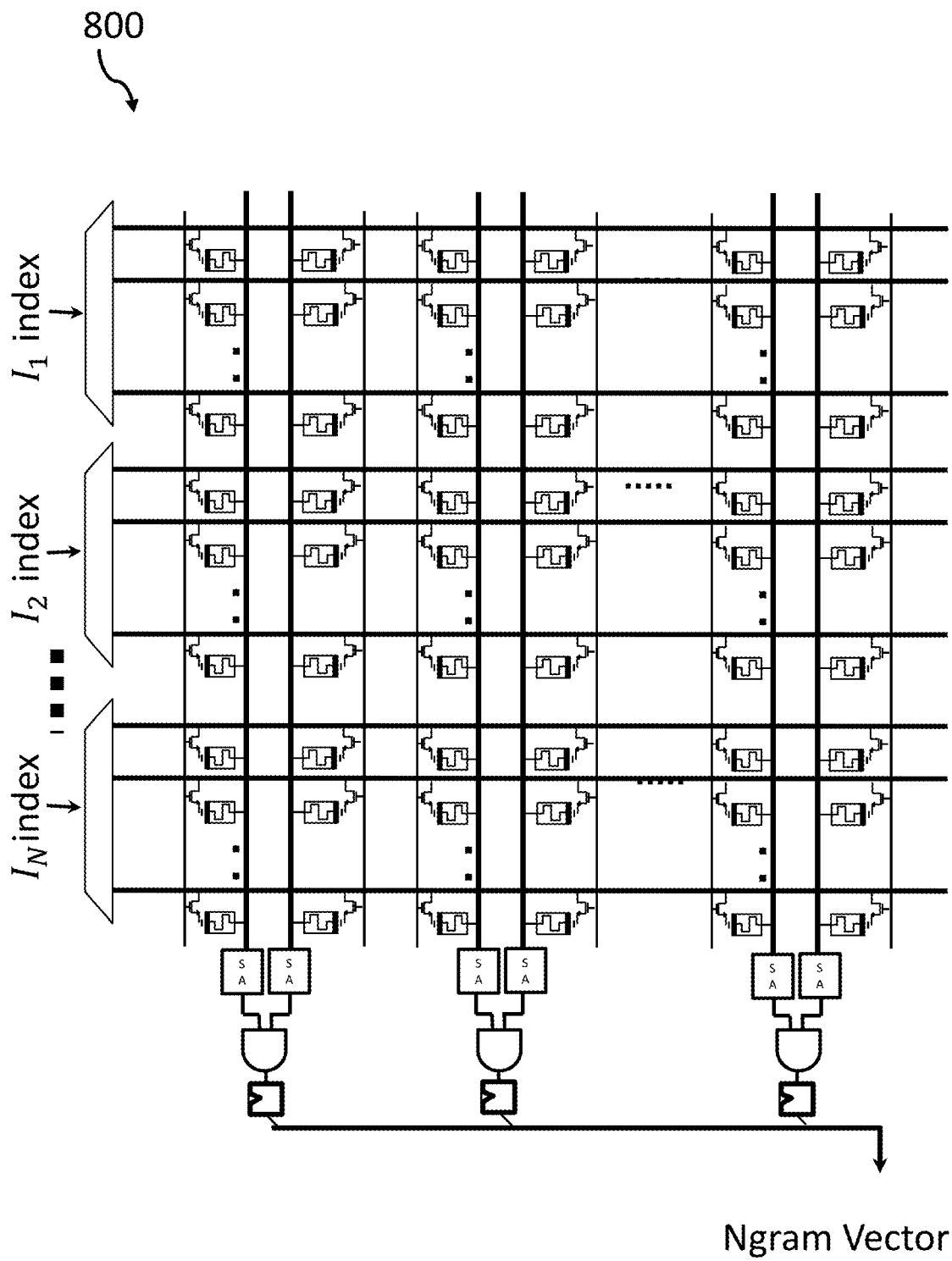

FIG. 8 shows a diagram of a seventh embodiment of a device for high-dimensional computing with a plurality of crossbars and an encoding with two maxterms in-memory binding.

Figure 9:
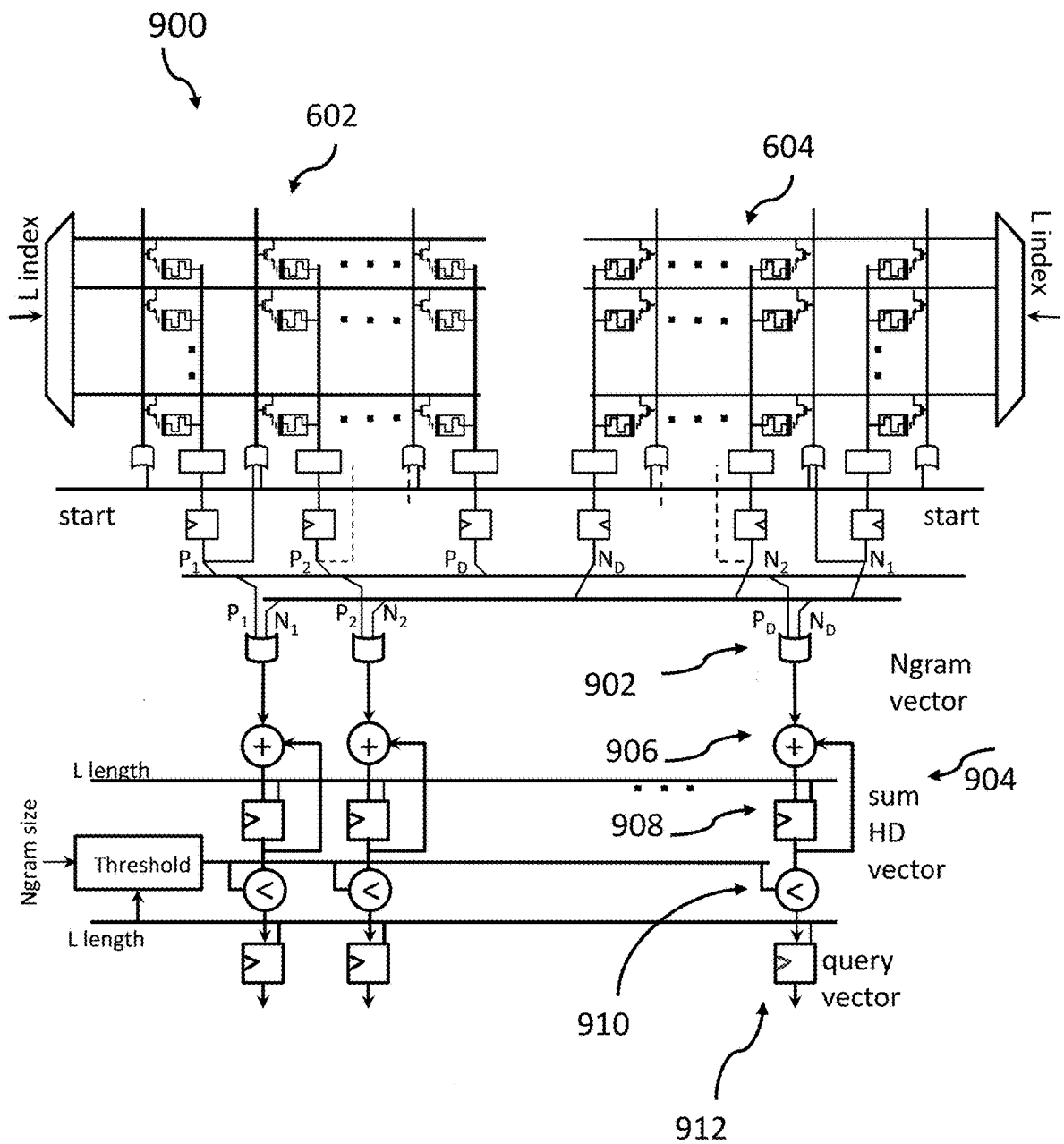

FIG. 9 shows a diagram of a full encoder which encodes a hold sequence into either a profile HD vector during training time or a query HD vector during inference time.

FIG. 10 shows a block diagram of a flowchart of an exemplary method for hyper-dimensional computing

DETAILED DESCRIPTION

In the context of this description, the following conventions, terms and/or expressions may be used:

The term 'hyper-dimensional computing' may denote a brain-inspired non-von-Neumann machine-learning model based on representing information with high-dimensional vectors (thousands of dimensions, e.g., 10k dimensions). Hyper-dimensional (HD) vectors—or exchangeably used high-dimensional vectors—are holographic, meaning that each bit position may have an equal weight in contrast to a conventional model with most significant bits and least significant bits. Additionally, the dimensional values of the hyper-dimensional vectors are (pseudo-) random with independent and identical distribution (i.i.d.) components.

By its nature, an HD computing device may be extremely robust in the presence of failure, defects, variations and noise, all of which make it very well suited for ultralow energy computation on nano-scale fabrics such as computational phase-change memory devices (PCM).

At its very core, HD computing is about manipulating and comparing large patterns within the memory. A processor based on HD computing may be seen as an extremely wide data flow processor with a small instruction set of bit-level operations.

For learning and inference tasks, the HD processor is composed of three main modules: an item memory for random projection to the HD space, an encoding unit, and an associative memory (together with distance computing).

The first two units may utilize a random indexing with multiply-add-permute (MAP) operations that may allow a high degree of parallelism by needing each hyper-vector component to communicate with only a local component or its immediate neighbors. In the associative memory, the distance computing may be performed in a distributed fashion; however, it is the only operation that requires a contribution from all the hyper-vector components.

The term 'memristive device' may denote here a plurality of memristive components of passive two-terminal electrical components relating electric charge and magnetic flux linkage. The memristive device may comprise a plurality of memristors which electrical resistance is not constant but depends on the history of current that has been previously flown through the device, i.e., the present resistance may depend on how much electric charge has flown in what direction through it in the past. Thus, the device remembers its history. When electric power supply used for writing information into the device is turned off, the memristor "remembers" it's most recent resistance until it is turned on again. Memristors may, e.g., be implemented using thin films of titanium dioxide. Many other material compositions may be available for memristive devices, often implemented in the form of phase change devices.

The term 'hyper-dimensional vector'—or high-dimensional vector or HD vector—may denote a vector with thousands of dimensions e.g., 10 k dimensions as used exemplarily throughout this description. However, also any other number above 1000 dimension may be suitable.

The term 'crossbar array' may denote an array of components—in particular memristive 2D components—in which word-lines (thought to be horizontal in a graphical representation) and bit-lines (thought to be vertical in a graphical representation) cross each other. At each crossing a component may be selectable and activatable by a related bit activation line. The word-line may be used for a selection of a particular stored HD vector (thought to be stored in components of a horizontal line in a graphical representation).

The term 'memristive 2D component' may denote a single memristor component being implemented as a two-dimensional device in contrast to three-dimensional memristive devices. The advantage of two-dimensional devices is that they may be produced more reliably at lower prices than three-dimensional devices.

The term 'peripheral circuit' may denote electronic components outside the crossbar array. Elements of the peripheral circuit may be used to address word-lines of the crossbar array, select bit-lines and process signals from outputs of the memristive 2D components for encoding operations by itself or in combination with the memristive 2D components.

The term 'minterm buffer' may denote a plurality of one-bit minterm buffers, where the plurality may be equivalent to the number of dimensions of the HD vectors. A single one-bit minterm buffer may comprise a single bit latch adapted for storing individual bit values of a minterm generated by a single encoding operation.

The term 'minterm accumulation buffer' may denote a plurality of one-bit minterm accumulation buffers, where the plurality may be equivalent to the number of dimensions of the HD vectors. A single one-bit minterm accumulation buffer may comprise a single bit latch adapted for storing individual bit values of combined minterm operations of a plurality of encoding operations. The minterm accumulation buffer output represents the Ngram of a plurality of input HD vectors.

The term 'Ngram' may denote, in the fields of computational linguistics and probability, a contiguous sequence of N items from a given sample of text (or speech). The items may be phonemes, syllables, letters, words or base pairs according to the application. The Ngrams are typically collected from a text or speech corpus. When the items are words, Ngrams may also sometimes be called shingles. An Ngram of size 1 may be referred to as a "unigram"; size 2 is a "bigram" (or, less commonly, a "digram"); size 3 is a "trigram".

The term 'binding' may typically denote a multiply operation of HD vectors in the form of an XOR operation which makes the resulting output vector quasi-orthogonal to the operand vectors. Thus, the number of dimensions of the input vectors of a binding operation and the number of dimensions of the resulting output vector relate to the same hyper-dimensional space.

The proposed device for hyper-dimensional computing may offer multiple advantages and technical effects:

The proposed core of a hyper-dimensional computing device may combine a plurality of characteristics instrumental for a new computing architecture for machine learning without relying on a traditional von-Neumann architecture. The proposed concept relies on a brain-inspired alternative computing architecture using hyper-dimensional vectors—with number of dimensions in the range of several thousand, several 10,000 or even larger numbers—for representing information items as HD item vectors and store them in crossbar arrays using memristive 2D components, like phase change memory devices. Memristive 2D components may be easier producible and more cost-effective and more reliable than devices requiring 3D technologies.

The used devices for the crossbar array may allow an HD computing that may be insensitive against failures, defects, variation and noise and may operate with ultra-low energy consumption. Production methods are proven and reliable. Additionally, it is not required to transfer large amounts of data from one group of devices to another group of devices in the proposed concept again and again. Involved devices for storing and computing (i.e., encoding) may only operate with their next neighbors. Transferring data forth and back is not required.

Additionally, embodiments are possible in which a plurality of HD vectors may be bound together in one single step. It may only be required to store the HD item vectors in a plurality of its bit-shifted versions. This may increase the number of crossbar arrays; however the advantage in processing speed increase may be significant.

Furthermore, the here proposed concept implemented in a plurality of embodiments may use a plurality of approximations for binding operations which achieve performance close to a complete binding operation but may require much less hardware resources and may thus be easier and cheaper to produce.

In contrast to other brain-inspired approaches such as deep learning, in which learning is computationally much more demanding than subsequent classification, learning in HD computing is fast and computationally balanced with respect to classification by reusing the same operators. The learning algorithm in HD computing works in one- or few-shots, i.e., object categories are learned from one or few examples, and in a single pass over training data as opposed to iterations. HD computing also produces transparent representation due to its well-defined set of arithmetic operations with distributivity and invertibility. HD computing requires far fewer operations to achieve the same functionality than other approaches such as support vector machines, k-nearest neighbors algorithm, multi-layer perceptrons, and convolutional neural networks. Finally, the proposed in-memory implementation of HD computing by memristive 2D components results in substantial savings in area and energy consumption compared to other state-of-the-art technologies, e.g., CMOS technology.

In the following, additional embodiments—applicable to the system as well as to the method—will be described:

According to one preferred embodiment of the device, the cross-bar array of memristive 2D components may comprise a plurality of pairs of columns of the memristive 2D components, wherein a number of pairs of the memristive 2D components per row may be equal to the dimensionality of the hyper-dimensional vectors. Thereby, a first sub-column of each of the pairs of columns may be adapted for storing positive values of the elements of hyper-dimensional vectors and a second sub-column of each of the pairs of columns may be adapted for storing corresponding negative values (two's complement) of the elements of hyper-dimensional vectors. In this embodiment, two corresponding memristive 2D components may store a value of one dimension of a hyper-vector as well as its complement value. Thus, the positive as well as the corresponding negative dimension value, may be available directly and without any upfront conversion for a binding operation, e.g., for XOR operations in the memory domain.

According to one enhanced and preferred embodiment of the device, the peripheral circuit may comprise a multiplexer—in particular for a polarity select—per column which first input terminal may be connected to the 2D memristive components of the first sub-column of a respective one of the pairs of columns and which second input terminal may be connected to the 2D memristive components of the second sub-column of a respective one of the pairs of columns. Furthermore, a one-bit minterm buffer per column may be connected to an output terminal of the multiplexer, wherein a plurality of all one-bit minterm buffers of all columns represent a minterm buffer of a binding of selected ones of hyper-dimensional vectors stored in the crossbar array. Thus, the encoding according to this embodiment may be performed in the digital domain, in particular directly using the 2D memristive components.

According to an even further enhanced and preferred embodiment of the device, the peripheral circuit may also comprise a connection from an output of one of the one-bit minterm buffers via an OR-gate and a driver to a bit-line of a next pair of columns of the first crossbar array. This may enable a bit-shift of the previous item hyper-vector.

According to an even further enhanced and preferred embodiment of the device, the peripheral circuit may also comprise a minterm accumulation buffer including a plurality of one-bit minterm accumulation buffers, where the plurality corresponds to the dimensionality of the hyper-dimensional hyper-vectors. Thereby, each of the plurality of one-bit minterm accumulation buffers may be connected with its input line via an OR-gate to an output of one of the one-bit minterm buffers, such that a plurality of all one-bit minterm accumulation buffers may represent an Ngram hyper-dimensional vector of a binding of selected item hyper-dimensional vectors. With this, the wiring of a first more complete embodiment is described in enabling in its entirety a hardware architecture that may perform an encoding using XOR binding, wherein the encoding operation may be performed in two steps which may include (i) creating the necessary minterms in the SoP expression (Sum of Products) for an N-input XOR function and (ii) summing the minterms.

Actually, the embodiments described in the last four paragraphs may relate to FIG. 2, described below.

According to another advantageous embodiment of the device, each crossing of a bit-line and a word-line may comprise a memristive 2D component, and output lines of these memristive 2D components may be connected to a common bit-line—which input lines may, in particular, be connected to an enable signal line—which may be connected via a sense amplifier and an XOR-gate to a one-bit buffer. The plurality of the one-bit buffers, each of which may be related to one column of the first crossbar array, may represent one bit of a resulting Ngram vector of a binding of selected item hyper-dimensional vectors. Additionally, an output of the one-bit buffer may be connected to a next XOR-gate of a next column.

It may be noted that in this case the encoding may be performed in the digital domain such that the memristive 2D components may only be used for storing the dimensional values of the related hyper-dimensional item vectors for which a binding should be performed. This embodiment may relate to FIG. 3, described below.

According to another preferred embodiment of the device, output lines of the memristive 2D components connected to a common bit-line may be connected via a sense amplifier to a one-bit minterm buffer. Thereby, a plurality of the one-bit minterm buffers, each of which being related to one column of the first crossbar array, may represent one bit of a resulting Ngram vector of a binding of selected item hyper-dimensional vectors. Additionally, an output line of each of the one-bit minterm buffer may be connected via an OR-gate to a bit-line of a next column. It may also be useful connecting a second input of the OR gates to a start line. This embodiment may represent an approximation of an XOR-enabled in-digital, i.e., implemented in the digital domain, encoding of hyper-dimensional vectors. This embodiment may relate to FIG. 4, described below.

According to one alternatively preferred embodiment of the device, the resistive memory device may comprise a second crossbar array of the components, wherein the components are memristive 2D components, addressable by word-lines and bit-lines. The first crossbar may be adapted for storing item hyper-dimensional vectors and the second crossbar array may be adapted for storing negative (two's complement) bit values of dimension values of the item hyper-dimensional vectors. Such arrangement of memristive 2D components may be more implementation friendly because the crossbar for the positive values of the item hyper-dimensional vectors and the relating negative values of the item hyper-dimensional vectors are disjoint. Each crossbar would require to be addressed by its own index selection circuit (L index). Such disjoint crossbars may be a prerequisite for easier implementation in which the binding of hyper-dimensional vectors happens in the digital domain.

According to an advanced alternatively preferred embodiment of the device, output lines of column output circuits—in particular sense amplifiers, OR-gates, AND-gates—of the first crossbar array and corresponding column output circuits of the second crossbar array may be connected via an AND-gate to respective one-bit minterm buffers which output line is connected to the AND-gate of a respective next column output circuit via an OR-gate. This way, a connection from one column to the next column may be implemented for each of the two crossbars such that a binding in the digital domain may be implemented in a straightforward manner.

According to a further advanced alternatively preferred embodiment of the device, the one-bit minterm buffers may be pairwise connected to input lines of respective OR-gates, from which one may relate to the first crossbar array and the other one may relate to the second crossbar array. This way, a plurality of output lines of the respective OR-gates may represent together a resulting Ngram vector of a binding of selected item hyper-dimensional vectors in which the binding between hyper-dimensional item vectors happen in the digital domain. The last three embodiments may relate to FIG. 5, as described below.

According to one optional embodiment of the device, an output value of components relating to a common bit-line may be connected via respective sense amplifiers to one-bit minterm buffers, wherein an output line of each of the one-bit minterm buffers may be connected via an OR-gate to a bit-line of a next column within their respective crossbar array. This embodiment may represent that corresponding in-memory domain implementation when compared to the previous embodiment with two crossbars for the item memory and the complement item memory.

According to a further optional embodiment of the device, which builds on embodiment of the previous paragraph, the one-bit minterm buffers may be pairwise connected to input lines of respective OR-gates, one relating to the first crossbar array and one relating to the second crossbar array, such that a plurality of output lines of the respective OR-gates represent together a resulting Ngram vector of a binding of selected item hyper-dimensional vectors. This may render the two crossbar arrays with the output circuitry more complete for the relating in-memory implementation of a binding using an encoder for the resulting Ngram vector. Actually, the here described last three embodiments may relate to FIG. 6, as described below.

According to a further advanced embodiment, the device may also comprise a plurality of N crossbar arrays, wherein each one of the plurality of N crossbar arrays may be adapted for storing the plurality of item vectors, wherein the n-th crossbar array may be adapted for storing the item vectors shifted by n-1 bits and wherein a plurality of peripheral circuit one-bit buffers may represent an Ngram vector of a binding of selected item hyper-dimensional vectors. Such an embodiment may be enabled to perform the encoding using single maxterms through an in-memory binding. Using maxterms may allow achieving a similar classification accuracy than through minterm operations. By this, performing N-input OR functions in-memory in a single step, one may reduce the number of steps to encode an Ngram to 1. This may represent a significant speed increase for generating the encoded Ngrams. As shift operations or options, a left-shift, a right-shift or a circular shift operation may be equivalent. A diagram of this embodiment is shown in FIG. 7.

According to an enhanced version of the previous embodiment, in the device each one of the plurality of N crossbar arrays may comprise a plurality of pairs of columns of the memristive 2D components, wherein a first sub-column of each of the pairs of columns may be adapted for storing positive values of the elements of the hyper-dimensional vectors stored and a second sub-column of each of the pairs of columns may be adapted for storing corresponding negative values of the elements of hyper-dimensional vectors stored. Thus, this embodiment may operate with an approximation obtained with two maxterms for performing the in-memory binding. A diagram of this embodiment is shown in FIG. 8.

According to one additionally advantageous embodiment of the device, each data line representing one dimension of the Ngram vector may be connected to a summing circuit, wherein the plurality of summing circuits represent a sum of Ngram vectors as a sum hyper-dimensional vector. Note that the elements of a sum hyper-dimensional vector are not binary digits, but rather integer numbers. Each of the previously presented embodiments may be combinable with these summing circuits. This embodiment may even be further enhanced:

According to one even more advanced and advantageous embodiment of the device, the output of each of the plurality of summing circuits, representing a sum of Ngram vectors may be compared with a threshold each to determine a binary decision, which may be input to respective ones of a plurality of one-bit decision buffers, so that the plurality of one-bit decision buffers may represent a query or profile vector. This embodiment may represent the complete memory/encoding logic—which may be used for the learning phase as well as for the query or prediction phase—to generate an Ngram hyper-dimensional vector for learning purposes or query purposes. A direct consequence of this architecture may lie in the fact that the architecture may work independently of the purpose the Ngram hyper-dimensional vector is built for: learning or query.

According to one embodiment relating to the previously-described embodiment of the device, the threshold may depend on the number of terms (minterms or maxterms) used to generate one Ngram vector and the total number of Ngrams to be generated in a sequence. This may be a prerequisite to operate the summing circuits for different one of the above discussed embodiments because they may work with a different number of minterms or maxterms. It may also be noted that the threshold value may depend on N, the number of item vectors forming the Ngram.

Now turning to further embodiments of the method: According to one advantageous embodiment of the method, the determining the Ngram hyper-dimensional vector may also be a feedback interaction of the output portion of the peripheral circuit to the crossbar array such that bit-lines of the crossbar array may be selectively activated by the output portion of the peripheral circuit. This way output signals from one column of memristive 2D components may trigger a function in a next column allowing operation in the memory domain.

According to an alternative, advantageous embodiment, the method may also comprise combining output signals from memristive 2D components in bit-lines by digital components—in particular, sense-amplify circuits, OR-gates, AND-gates—so as to perform the encoding in the digital domain outside of the crossbar array.

In the following, details of the figures will be discussed:

FIG. 1 shows a diagram of an embodiment of an architecture 100 for which the here proposed high-dimensional computing device is suitable. It may best be explained by describing an application of the technology. It should be assumed to have the task of classifying a text into one of the 21 European languages. Each of the 27 letters 102 of the alphabet is encoded as a 10 k-dimensional random hyper-vector in the item memory 104. It should be clear that not only letters may be used as input values but any feature describable with a comparably low number of bits. Thus, the interface from the sample—i.e., a text of letters—to the item memory 104 may be in the range of 8 or 16 or a similar number of bits.

A training of the hyper-dimensional classifier comprises representing Ngrams of a text of the different languages by binding N hyper-vectors from the item memory 104 into a single Ngram hyper-vector with an encoder, represented by the combined storage and encoding unit 112, comprising the item memory 104 and the MAP encoder (Multiply-Add-Permute) 106. Thus, multiple Ngram hyper-vectors of the same language are then accumulated to form a language hyper-vector that would be stored in an associative memory 108. Consequently, typical characteristics of one language are stored as one HD vector in the associative memory 108. The training is complete once the 21 language hyper-vectors have been generated and are stored in the associative memory 108.

For inference, an input text—composed of letters—from an unknown language is converted into a query HD vector using exactly the same encoder as for training, i.e., constructing Ngram HD vectors and accumulating them. The query vector is then input to the associative memory which performs a similarity measurement or distance measurement of the learned 21 language HD vectors in comparison to the query HD vector to determine which language of the query hyper-vector has the shortest distance to one of the hyper-vectors of the 21 language HD vectors. The language HD vector having the shortest distance to the query hyper-vector is the result, the output 110, i.e., represents the language of the unknown language input as query to the hyper-dimensional computing device 112.

Before further embodiments will be described, it may be instrumental to look at encoding operations of the HD vectors being performed in the MAP encoder 106.

The item—in the above example, a letter—in this sequence is projected to the D-dimensional hyper-dimensional space through retrieving corresponding entries from the item memory 104. N consecutive items are bound together using permute multiply operations to create the binary Ngram HD vector. The equation for a trigram (N=3) $Ng(I_1 I_2 I_3)$ may be expressed as follows:

$$Ng(I_1 I_2 I_3) = \rho\rho(I_1) \oplus \rho(I_2) \oplus (I_3), \text{ wherein}$$

$\rho$ denotes a bit shift operation in the corresponding item vector $I_n$ ($\rho\rho$ means two 1-bit shift operations). Thereby, the bit-shift operation may be a left shift, a right shift or a circular shift operation; the $\oplus$ sign represents a binary operator binding two hyper-vectors.

The L Ngram HD vectors from the sequence are summed to create the accumulated HD vector, with elements being integer numbers. For N=3:

$$\text{Sum } HV = \Sigma^L_{k=1} NG(I_k I_{k+1} I_{k+2}).$$

Once the L Ngrams from the sequence (of letters) are accumulated, vector elements are binarized by applying a threshold function to create the class profile HD vector:

Profile $HV(i)=1$ if (Sum $HV(i)$>threshold), 0 otherwise, $1 \leq i \leq D$.

A typical multiply operation used in the binding stage is the XOR operation, because it determines output HD vectors that are quasi-orthogonal to the operand vectors.

One can expand the XOR function in terms of AND and OR logic functions as follows:

$$\begin{aligned}
Ng(I_1 I_2 I_3) &= \rho\rho(I_1) \oplus \rho(I_2) \oplus (I_3) \quad &(\text{Eq. 1}) \\
&= \{((\rho\rho\overline{I_1}) \& (\rho I_2)) | ((\rho\rho I_1) \& (\rho\overline{I_2}))\} \oplus (I_3) \\
&= (\rho\rho I_1 \& \rho I_2 \& I_3) | (\rho\rho\overline{I_1} \& \rho\overline{I_2} \& I_3) | \\
&\quad (\rho\rho\overline{I_1} \& \rho I_2 \& \overline{I_3}) | (\rho\rho I_1 \& \rho\overline{I_2} \& \overline{I_3})
\end{aligned}$$

In the last expression, the XOR function is represented in "sum of product" (SoP) form, wherein one product term is also called "minterm". Equivalently, an XOR function may be represented in "product of sum" form, wherein one sum term is also called "maxterm".

FIG. 2 shows a diagram of a first embodiment of a circuitry 200 for high-dimensional computing in which the encoding is performed in the memory domain. The shown circuitry 200 performs encoding using XOR binding, wherein the encoding operation is performed in two steps, including:
1. creating the necessary minterms in the SoP expression for the N-input XOR function, and
2. summing the terms together using an OR function.

The device is arranged in a 2D crossbar array, with pairs 202, 204, 206 of columns. The number of column pairs is equal to the dimensionality of the hyper-vectors. Thereby, the number of rows corresponds to the number of entries in the item memory (compare FIG. 1, 104). The memristors in one sub-column of a column pair store the values of the corresponding item vectors' bit position. The memristors in the other sub-column of the column pair store the negative values (two's complement) of the corresponding item vectors' bit position. The two sub-columns are shown exemplary for the column 206 as reference numerals 208 and 210. A start signal 214 at the beginning of the Ngram generation will enable all the bit-line pairs and will reset the "minterm accumulation buffer" 218 (the plurality of latches, one for each column).

When fetching HD vectors a "polarity select" 216 will select data from either a positive column (e.g., 208 and corresponding) or a negative column (e.g., 210 and corresponding).

Upon completion of a binding of a minterm, the result is passed on from the minterm buffer 212 to the "minterm accumulation buffer" 218.

As can be seen, an output signal of the one-bit minterm buffer of a column is used as input signal—beside the start signal to an OR gate—exemplary denoted as 220 for column 204—in order to drive, via a driver, select-lines of respective columns/sub-columns to activate via a select transistor a memristive device which output is connected via a polarity select multiplexer—exemplary denoted as 222 for column 204—with an input line of the one-bit minterm buffer 212.

The plurality of all output lines of the minterm accumulation buffer (in the range of 10 k) represents the Ngram vector generated by the item memory storage (compare FIG. 1, 104)/encoder combination (compare FIG. 1, 112). It may also be noted that a selection of the L-th hyper-vector in the array is performed using the selector 224.

In operation, the sum of product (Eq. 1 above, in a different sequence of the sum terms)

$$(\rho\rho\overline{I_1}\&\rho\overline{I_2}\&I_3)|(\rho\rho\overline{I_1}\&\rho I_2\&\overline{I_3})|(\rho\rho I_1\&\rho\overline{I_2}\&\overline{I_3})|(\rho\rho I_1\&\rho I_2\&I_3)$$

is formed step by step:
Firstly, a first row is selected corresponding to the L1 HD vector as well as the negative polarity.
This will update $I_1$—in particular $\overline{I_1}$—in the minterm buffer 212.
Then, the L2 row is selected with negative polarity.
This will lead to the minterm buffer 212 being updated with $\rho\overline{I_1}\&\overline{I_2}$.
Then, the steps will be repeated for the letter index and the polarity selection for the rest of the letters in the minterm until it gets updated in the minterm buffer; in the used example $$(\rho\rho\overline{I_1}\&\rho\overline{I_2}\&I_3).$$

The intermediate result will be transferred to the minterm accumulation buffer 218 which then also holds $(\rho\rho\overline{I_1}\&\rho\overline{I_2}\&I_3)$.

These steps would be repeated for the other minterms in the above expression which may result in $(\rho\rho\overline{I_1}\&\rho I_2\&\overline{I_3})$ in the minterm buffer 212 and after accumulation in the minterm accumulation buffer 218: $(\rho\rho\overline{I_1}\&\rho\overline{I_2}\&I_3)|(\rho\rho\overline{I_1}\&\rho I_2\&\overline{I_3})$.

Finally, after repeating the necessary steps, the complete sum of products is available in the minterm accumulation buffer 218 as an encoded Ngram vector.

The device of the embodiment of FIG. 1 represents a complete in-memory implementation. The embodiment may be denoted as in-memory, because the operations are mainly done in the memristive 2D devices by properly activating in sequence the memristive devices.

However, also a more hardware friendly in-memory encoding is possible. This is shown in the next embodiments illustrated by the subsequent FIGS. 2 to 5.

Similar to XOR, also XNOR operation can perform binding on vectors—in particular hyper-vectors—such that the related output becomes quasi-orthogonal to input vectors.

For Ngram sizes with even N, and XNOR based binding of hyper-vectors, the sum of product expression has two particularly notable minterms: the product of all inputs in positive form as well as the product of all inputs in negative form.

In order to build simpler hardware, one may consider approximating the binding operation by including:
1. A single minterm which includes the product of all inputs in positive form;
2. Two minterms which include the product of all inputs in positive form and in negative form, respectively.

By adding an additional minterm in the second alternative, the classification accuracy can be increased by approximating the XNOR operation more closely. Thus, it may be useful to generalize the above alternatives for odd Ngram sizes, as well as to make the encoding hardware simpler and more universal. This may reside in microarchitectures for both, in memory binding, as well as binding in the digital domain.

FIG. 3 shows a diagram of a second embodiment of a device 300 for high-dimensional computing in which the encoding happens in the digital domain with straightforward encoding using XOR gates.

The array 302 now comprises columns with single memristive 2D components enabled by an enable signal 304, which bit-lines are connected to a sense amplifier 306 per column, and which are connected via XOR gates to the buffer 308 (compare FIG. 2). In this example, there are no feedback lines into the memory domain from one column to the next column.

Also here, a series of steps happens to build the respective Ngram:
Firstly, all bit-lines are enabled and the L1 index activates the respective row by the row decoder 310. As a consequence, $I_1$ is updated in the Ngram accumulation buffer 308.

Then, the index L2 of item-2 $I_2$ is fed through the row decoder 310 and the $I_2$ hyper-vector will be bound with the shifted version of the previously stored result of the buffer register, giving $\rho I_1 \oplus I_2$.

The above steps are then repeated for the remaining letters in the Ngram.

This will update the Ngram in the buffer 308. If N=3, the result will be $\rho\rho I_1 \oplus \rho I_2 \oplus I_3$.

Again, this embodiment is denoted as "in-digital" because all binding logic operations are done in the digital domain.

FIG. 4 shows a diagram of a third embodiment of a device 400 for high-dimensional computing in which the encoding happens in the memory domain (by computing a single minterm with all-positive values). In this example, output signals from the buffer 402 are sent back as bit-line enable signals via OR-gates 404, which second input line is connected to a start signal 406. The remaining components are comparable to those of the preceding figures. Also, in this embodiment the single all-positive minterm ($\rho\rho I_1$ & $\rho I_2$ & $I_3$), which represents an approximation of the XNOR-based Ngram encoding, is built in a stepwise approach as before.

FIG. 5 shows a diagram of a fourth embodiment of a device 500 for high-dimensional computing with two crossbars and binding logic operations in the digital domain. Here, two minterms, the all-positive minterm and the all-negative minterm may be used, which results in an approximation of the XNOR-based Ngram encoding as:

$$(\rho\rho I_1 \& \rho I_2 \& I_3) | (\rho\rho \overline{I_1} \& \rho \overline{I_2} \& \overline{I_3}).$$

In this case, two crossbar arrays 502, 504 of memristive 2D components are used, one is item memory 502 and the other one is a negative (two's complement) 504 of the item memory. The stepwise binding operation is performed in the digital domain, i.e., binding logic operations are performed in the digital domain, with no loopback signals from one column of the crossbar to the memristive devices of the next column of the crossbar. All operations are done in the lower part of the figure using sense amplifiers 506 as well as OR-gates, AND-gates and buffers, as in the embodiments above.

FIG. 6 shows a diagram of a fifth embodiment of a device 600 for high-dimensional computing with two crossbars and an encoding in the memory domain. Again, two minterms, the all-positive minterm and the all-negative minterm may be used:

$$(\rho\rho I_1 \& \rho I_2 \& I_3) | (\rho\rho \overline{I_1} \& \rho \overline{I_2} \& \overline{I_3}).$$

In this case, in each of the arrays 602, 604 of memristive 2D components feedback loops are implemented from one column to a next column and the Ngram vector is built by a plurality of OR-gates receiving as input signals respective positive and negative signals from the buffers 608 related to the positive HD vectors stored in the array 602 and the negative HD vectors stored in the array 604. The Ngram vector will be available as output signals from the plurality of OR gates 606.

Before turning to the next figures, an alternative for the above described hyper-dimensional in-memory Ngram encoding should be discussed:

By applying De Morgan's, law the equation relating to FIG. 5 for the two all-positive, all-negative minterms solution $(\rho\rho I_1 \& \rho I_2 \& I_3) | (\rho\rho \overline{I_1} \& \rho \overline{I_2} \& \overline{I_3})$, one can get the following expression $$(\rho\rho I_1 | \rho I_2 | I_3) \& (\rho\rho \overline{I_1} | \rho \overline{I_2} | \overline{I_3}).$$

The terms separated by "&" are called "maxterms".

Using this maxterm expression, it is possible to achieve a similar classification accuracy if compared to the corresponding minterm solution (as in FIG. 5). To perform the encoding using the maxterms, here an architecture with a PCM array is proposed that stores the N permutations of item memory vectors required by the Ngram size.

By performing the N-input OR function in-memory in a single step it is also possible to reduce the number of total steps for encoding a complete Ngram down to 1 step. This may represent a significant performance increase if compared to earlier discussed embodiments.

As in previous cases with minterms, two approximations—single maxterm and two maxterms, respectively—are presented in FIG. 7 and FIG. 8, respectively.

FIG. 7 shows a diagram of a sixth embodiment of a device 700 for high-dimensional computing with a plurality of crossbars—in particular arrays 702, 704, 706—and an encoding with a single maxterm in-memory binding. The total number of crossbar arrays is equal to the number of N item vectors to be bound. Each crossbar array 702, 704, 706 stores respective item vectors $I_1, I_2, \ldots, I_N$ in all their bit shift versions. Sense amplifiers 708 accumulate the bit-line output signals of the memristive 2D components of a column using the plurality of buffers 710 representing the Ngram vector which will be generated in a single step. The present embodiment represents an in-memory binding of the form $$(\rho^{N-1} I_1) | (\rho^{N-2} I_2) | (\rho^{N-3} I_3) \ldots.$$

FIG. 8 shows a diagram of a seventh embodiment of a device 800 for high-dimensional computing with a plurality of crossbars and an encoding with two maxterms in-memory binding. Here, the encoding relates to two maxterms, according to $$(\rho^{N-1} I_1) | (\rho^{N-2} I_2) | (\rho^{N-3} I_3) \ldots \& (\rho^{N-1} \overline{I_1}) | (\rho^{N-2} \overline{I_2}) | (\rho^{N-3} \overline{I_3}) \ldots.$$

In this embodiment, again the memristive 2D components are used per column for both, dimension values of the item vector as well as complement dimension values of the item vector. As can be seen, there is no feedback loop from one column to the next column; thus, also this embodiment is an in-memory implementation.

FIG. 9 shows a diagram of a full encoder 900 which encodes a symbol sequence into either a profile HD vector during training time or a query HD vector during inference time.

For illustration purposes, the Ngram encoder of FIG. 6 is used; however, practically also all other Ngram encoders of the FIGS. 2, 3, 5, 6, 7 and 8 can as well be used.

The threshold value applied on the sum HD vector at the end of the sequence which is of length L is calculated as:

K-Minterms (FIGS. 3,4,5,6) $L/(2^{N-\log K})$

K-Maxterms (FIGS. 7,8) $L(1-L/(2^{N-\log K}))$

The threshold for the XOR-based binding according to the embodiments of FIG. 2 or FIG. 3 is L/2, which is a particular case for K-minterms.

Thus, FIG. 9 shows the two crossbar arrays 602 and 604 of FIG. 6 in which the Ngram vector is accessible by the output of the plurality of OR-gates 902 taking the positive partial Ngram vector and the negative partial Ngram vector as input.

A sum HD vector unit 904 is built from a plurality of summing units 906 and buffers 908 to which a threshold comparison unit 910 is connected.

If the complete device is used for generating a query vector, this is represented in the plurality of buffers 912. Otherwise, a training vector for one of the languages (see above) would be available in the plurality of buffers 912.

FIG. 10 shows a block diagram of a flowchart of the method 1000 for hyper-dimensional computing. The method 1000 comprises storing, 1002, elements of hyper-dimensional vectors in a resistive memory device as conductive statuses in components of the resistive memory device. Thereby, the resistive memory device comprises a first crossbar array of the components, wherein the components are memristive 2D components addressable by word-lines and bit-lines. The method 1000 comprises further connecting, 1004, a peripheral circuit to the word-lines and bit-lines which is adapted for encoding operations by activating the word-lines and bit-lines sequentially in a predefined manner, activating, 1006, selectively word-lines of hyper-dimensional vectors in the crossbar array, wherein the selected hyper-dimensional vectors are to be bound together, and determining, 1008, an Ngram hyper-dimensional vector by a binding operation using an output portion of the peripheral circuit.

Additionally, the method comprises combining, 1010, output signals from memristive 2D components in bit-lines by digital components so as to perform the encoding in the digital domain outside of the crossbar array (e.g., by building a sum of the Ngram vectors and the binary decision via thresholding).

The present invention may be implemented as a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other devices to cause a series of operational steps to be performed on the computer, other programmable apparatus or other devices to produce a computer implemented process, such that the instructions which execute on the computer, other programmable apparatus, or other devices implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A device for hyper-dimensional computing, the device comprising:
   a resistive memory device for storing elements of hyper-dimensional vectors as conductive statuses in components of the resistive memory device,
   wherein the resistive memory device comprises a first crossbar array of the components, wherein the components are memristive 2D components addressable by word-lines and bit-lines, and
   a peripheral circuit, having an output portion, and being connected to the word-lines and bit-lines and adapted for encoding operations by activating the word-lines and bit-lines sequentially in a predefined manner, the peripheral circuit being further adapted to selectively activate word-lines of hyper-dimensional vectors in the crossbar array, wherein the selected hyper-dimensional vectors are to be bound together, and to determine an Ngram hyper-dimensional vector by a binding operation using the output portion of the peripheral circuit.

2. A device for hyper-dimensional computing, the device comprising:
   a resistive memory device for storing elements of hyper-dimensional vectors as conductive statuses in components of the resistive memory device,
   wherein the resistive memory device comprises a first crossbar array of the components, wherein the components are memristive 2D components addressable by word-lines and bit-lines, and
   a peripheral circuit connected to the word-lines and bit-lines and adapted for encoding operations by activating the word-lines and bit-lines sequentially in a predefined manner;
   wherein the cross-bar array of memristive 2D components comprises:
   a plurality of pairs of columns of the memristive 2D components,
   wherein a number of pairs of the memristive 2D components per row is equal to the dimensionality of the hyper-dimensional vectors,
   wherein a first sub-column of each of the pairs of columns is adapted for storing positive values of the elements of a hyper-dimensional vectors stored and a second sub-column of each of the pairs of columns is adapted for storing corresponding negative values of the elements of hyper-dimensional vectors stored.

3. The device according to claim 2, the peripheral circuit comprising:
   a multiplexer per column which first input terminal is connected to the 2D memristive components of the first sub-column of a respective one of the pairs of columns, and which second input terminal is connected to the 2D memristive components of the second sub-column of a respective one of the pairs of columns, and
   a one-bit minterm buffer per column connected to an output terminal of the multiplexer, wherein a plurality of all one-bit minterm buffers of all columns represent a minterm buffer of a binding of selected ones of hyper-dimensional vectors stored in the crossbar array.

4. The device according to claim 3, the peripheral circuit also comprising:
   a connection from an output of one of the one-bit minterm buffers via an OR-gate and a driver to a bit-line of a next pair of columns of the first crossbar array.

5. The device according to claim 4, the peripheral circuit also comprises:
   a minterm accumulation buffer comprising a plurality of one-bit minterm accumulation buffers, each of which being connected with its input line via an OR-gate to an output of one of the one-bit minterm buffers, such that a plurality of all one-bit minterm accumulation buffers represent an Ngram hyper-dimensional vector of a binding of selected item hyper-dimensional vectors.

6. A device for hyper-dimensional computing, the device comprising:
   a resistive memory device for storing elements of hyper-dimensional vectors as conductive statuses in components of the resistive memory device,
   wherein the resistive memory device comprises a first crossbar array of the components, wherein the components are memristive 2D components addressable by word-lines and bit-lines, and
   a peripheral circuit connected to the word-lines and bit-lines and adapted for encoding operations by activating the word-lines and bit-lines sequentially in a predefined manner:
   wherein each crossing of a bit-line and a word-line comprises a memristive 2D component, and
   wherein output lines of memristive 2D components connected to a common bit-line are connected via a sense amplifier and an XOR-gate to a one-bit buffer, wherein a plurality of the one-bit buffers, each of which being related to one column of the first crossbar array, represents one bit of a resulting Ngram vector of a binding of selected item hyper-dimensional vectors, and
   wherein an output of the one-bit buffer is connected to a next XOR-gate of a next column.

7. A device for hyper-dimensional computing, the device comprising:
   a resistive memory device for storing elements of hyper-dimensional vectors as conductive statuses in components of the resistive memory device,
   wherein the resistive memory device comprises a first crossbar array of the components, wherein the components are memristive 2D components addressable by word-lines and bit-lines, and a peripheral circuit connected to the word-lines and bit-lines and adapted for encoding operations by activating the word-lines and bit-lines sequentially in a predefined manner:

wherein output lines of memristive 2D components connected to a common bit-line are connected via a sense amplifier to a one-bit minterm buffer, wherein a plurality of the one-bit minterm buffers, each of which being related to one column of the first crossbar array, represents one bit of a resulting Ngram vector of a binding of selected item hyper-dimensional vectors, and wherein an output line of each of the one-bit minterm buffer is connected via an OR-gate to a bit-line of a next column.

8. A device for hyper-dimensional computing, the device comprising:

a resistive memory device for storing elements of hyper-dimensional vectors as conductive statuses in components of the resistive memory device, wherein the resistive memory device comprises a first crossbar array of the components, wherein the components are memristive 2D components addressable by word-lines and bit-lines, and a peripheral circuit connected to the word-lines and bit-lines and adapted for encoding operations by activating the word-lines and bit-lines sequentially in a predefined manner:

wherein the resistive memory device comprises a second crossbar array of the components, wherein the components are memristive 2D components addressable by word-lines and bit-lines, wherein the first crossbar is adapted for storing item hyper-dimensional vectors, and the second crossbar array is adapted for storing complementary bit values of dimension values of the item hyper-dimensional vectors.

9. The device according to claim 8:

wherein output lines of column output circuits of the first crossbar array and corresponding column output circuits of the second crossbar array are connected via an AND-gate to respective one-bit minterm buffers which output line is connected to the AND-gate of a respective next column output circuit via an OR-gate.

10. The device according to claim 9, wherein the one-bit minterm buffers are pairwise connected to input lines of respective OR-gates, one relating to the first crossbar array and one relating to the second crossbar array, such that a plurality of output lines of the respective OR-gates represent together a resulting Ngram vector of a binding of selected item hyper-dimensional vectors.

11. The device according to claim 8:

wherein an output value of components relating to a common bit-line are connected via respective sense amplifiers to one-bit minterm buffers, wherein an output line of each of the one-bit minterm buffers is connect via an OR-gate to a bit-line of a next column within their respective crossbar array.

12. The device according to claim 11, wherein the one-bit minterm buffers are pairwise connected to input lines of respective OR-gates, one relating to the first crossbar array and one relating to the second crossbar array, such that a plurality of output lines of the respective OR-gates represent together a resulting Ngram vector of a binding of selected item hyper-dimensional vectors.

13. A device for hyper-dimensional computing, the device comprising:

a resistive memory device for storing elements of hyper-dimensional vectors as conductive statuses in components of the resistive memory device, wherein the resistive memory device comprises a first crossbar array of the components, wherein the components are memristive 2D components addressable by word-lines and bit-lines, and a peripheral circuit connected to the word-lines and bit-lines and adapted for encoding operations by activating the word-lines and bit-lines sequentially in a predefined manner, also comprising:

a plurality of N crossbar arrays, wherein each one of the plurality of N crossbar arrays is adapted for storing the plurality of item vectors, wherein the n-th crossbar array is adapted for storing the item vectors shifted by n-1 bits, and wherein a plurality of peripheral circuit one-bit buffers represent an Ngram vector of a binding of selected item hyper-dimensional vectors.

14. The device according to claim 13, wherein each one of the plurality of N crossbar arrays comprises:

a plurality of pairs of columns of the memristive 2D components, and wherein a first sub-column of each of the pairs of columns is adapted for storing positive values of the elements of the hyper-dimensional vectors stored, and a second sub-column of each of the pairs of columns is adapted for storing corresponding negative values of the elements of hyper-dimensional vectors stored.

15. A device for hyper-dimensional computing, the device comprising:

a resistive memory device for storing elements of hyper-dimensional vectors as conductive statuses in components of the resistive memory device, wherein the resistive memory device comprises a first crossbar array of the components, wherein the components are memristive 2D components addressable by word-lines and bit-lines, and a peripheral circuit connected to the word-lines and bit-lines and adapted for encoding operations by activating the word-lines and bit-lines sequentially in a predefined manner, wherein each data line representing one dimension of the Ngram vector is connected to a summing circuit, wherein the plurality of summing circuits represent a sum of Ngram vectors.

16. The device according to claim 15, wherein the output of each of the plurality of summing circuits representing a sum of Ngram vectors is each compared with a threshold value to determine a binary decision, which is input to a respective one of a plurality of one-bit decision buffers, and wherein the plurality of one-bit decision buffers represent a query or profile vector.

17. The device according to claim 16, wherein the threshold depends on the number of terms used to generate one Ngram vector and the total number of Ngrams to be generated.

18. A method for hyper-dimensional computing comprising:

storing elements of hyper-dimensional vectors in a resistive memory device as conductive statuses in components of the resistive memory device, wherein the resistive memory device comprises a first crossbar array of the components, wherein the components are memristive 2D components addressable by word-lines and bit-lines, and connecting a peripheral circuit to the word-lines and bit-lines which is adapted for encoding operations by activating the word-lines and bit-lines sequentially in a predefined manner, activating selectively word-lines of hyper-dimensional vectors in the crossbar array, wherein the selected hyper-dimensional vectors are to be bound together, and determining an Ngram hyper-dimensional vector by a binding operation using an output portion of the peripheral circuit.

19. The method according to claim 18, wherein the determining the Ngram hyper-dimensional vector also comprises a feedback interaction of the output portion of the peripheral circuit to the crossbar array such that bit-lines of the crossbar array are selectively activated by the output portion of the peripheral circuit.

20. The method according to claim 18, further comprising:

combining output signals from memristive 2D components in bit-lines by digital components so as to perform the encoding in the digital domain outside of the crossbar array.

* * * * *